(12) United States Patent
Gregoire et al.

(10) Patent No.: US 11,605,746 B2
(45) Date of Patent: Mar. 14, 2023

(54) SEMICONDUCTOR SUITABLE FOR USE IN PHOTOANODE

(71) Applicant: California Institute of Technology, Pasadena, CA (US)

(72) Inventors: John M. Gregoire, Sierra Madre, CA (US); Santosh Suram, Mountain View, CA (US); Lan Zhou, Pasadena, CA (US); Aniketa A. Shinde, Duarte, CA (US)

(73) Assignee: California Institute of Technology, Pasadena, CA (US)

( * ) Notice: Subject to any disclaimer, the term of this patent is extended or adjusted under 35 U.S.C. 154(b) by 222 days.

(21) Appl. No.: 17/067,530

(22) Filed: Oct. 9, 2020

(65) Prior Publication Data

US 2021/0111290 A1    Apr. 15, 2021

Related U.S. Application Data

(60) Provisional application No. 62/914,200, filed on Oct. 11, 2019.

(51) Int. Cl.
*H01L 31/032* (2006.01)
*C04B 35/495* (2006.01)

(52) U.S. Cl.
CPC .......... *H01L 31/032* (2013.01); *C04B 35/495* (2013.01); *C04B 2235/326* (2013.01); *C04B 2235/3298* (2013.01)

(58) Field of Classification Search
CPC ... H01L 31/032; C04B 35/495; C04B 35/326; C04B 35/3298
See application file for complete search history.

(56) References Cited

PUBLICATIONS

Sieber etal , "Preperation and propetis of substituted iron tungstates", Report (1982), TR-23, Order No. AD-A121699, 24 pgs, NTIS from Gov. Rep. Announce Index (US) 1983, 83(7), 1402.*

* cited by examiner

*Primary Examiner* — C Melissa Koslow
(74) *Attorney, Agent, or Firm* — Gavrilovich, Dodd & Lindsey LLP

(57) ABSTRACT

A composition of matter includes an n-type semiconductor. At least a portion of the semiconductor has the crystal structure of the chemical compound represented by $FeWO_4$. The portion of the semiconductor having the crystal structure of $FeWO_4$ includes iron and tungsten. A photoanode can have a light-absorbing layer that includes or consists of the semiconductor. A solar fuels generator can include the photoanode.

17 Claims, 3 Drawing Sheets

SEMICONDUCTOR SUITABLE FOR USE IN PHOTOANODE

CROSS REFERENCE TO RELATED APPLICATIONS

This application claims the benefit of U.S. Provisional Patent Application Ser. No. 62/914,200, filed on Oct. 11, 2019, which is incorporated herein in its entirety.

STATEMENT REGARDING FEDERALLY SPONSORED RESEARCH

This invention was made with government support under Grant No. DE-SC0004993/T-117274 awarded by the Department of Energy. The government has certain rights in the invention.

FIELD OF THE INVENTION

The invention relates to semiconductors, and more particularly, to photoanodes that include semiconductors.

BACKGROUND

A variety of different applications make use of the Oxygen Evolution Reaction (OER). Examples of these applications include solar fuels generation where energy from a light source drives the reaction at a photoanode. A photoanode semiconductor should absorb light at the desired wavelength. Since the desired light source is often the sun, it is generally desirable for these semiconductors to absorb light in the visible spectrum. Additionally, in order to achieve use the solar resource efficiently, it is desirable for these semiconductors to have turn-on potentials that are sufficiently low that the photovoltage obtained at operational current densities is a large fraction of the photoanode's band gap. Further, because these semiconductors are often exposed to acids and/or bases during operation of a solar fuels generator, it is often desirable for the semiconductor to be chemically stable under these operating conditions. Prior semiconductors that have been used in photoanodes have not been able to satisfy all three of these conditions. As a result, there is a need for improved semiconductors and improved photoanodes.

SUMMARY

The disclosure provides a composition of matter that includes an n-type semiconductor. At least a portion of the semiconductor has the crystal structure of the chemical compound represented by $FeWO_4$. The portion of the semiconductor having the crystal structure of $FeWO_4$ includes iron and tungsten. A photoanode can have a light-absorbing layer that includes or consists of the semiconductor. A solar fuels generator can include the photoanode.

The disclosure provides a composition of matter that includes a semiconductor represented by $Fe_{1-x}W_xO_v+y(BiO_z)$ wherein: $0<x<1$; $0\leq y<1$; $0<v<2$; and $1\leq z\leq 2$. At least a portion of the semiconductor is arranged in the crystal structure of $FeWO_4$. In some instances, the portion of the semiconductor arranged in the crystal structure of $FeWO_4$ has a chemical composition represented by $Fe_{1-x}W_xO_v$. A photoanode can have a light-absorbing layer that includes or consists of the semiconductor. A solar fuels generator can include the photoanode.

DETAILED DESCRIPTION

Figure 1A:
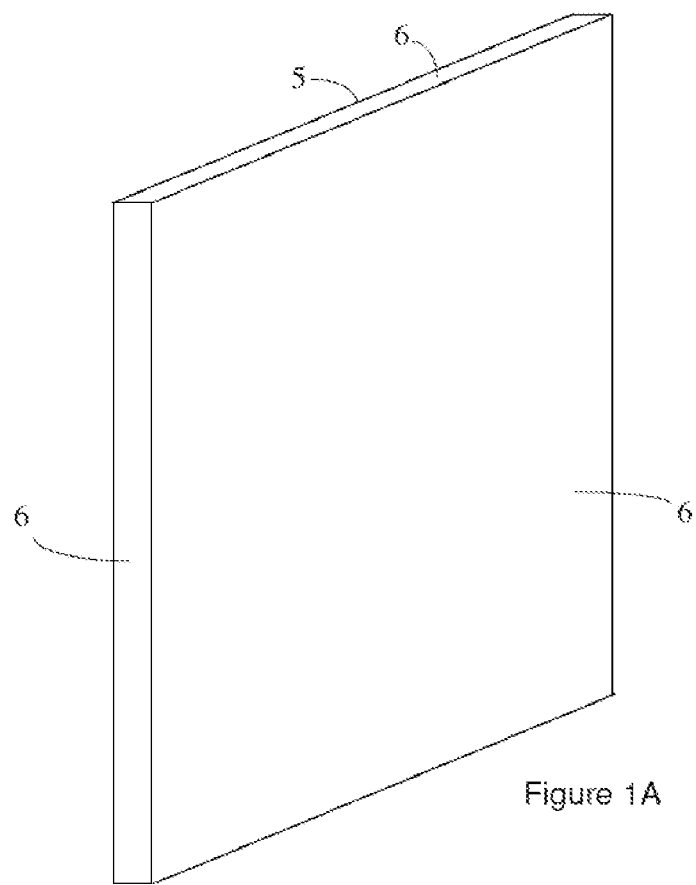
FIG. 1A is a perspective view of a semiconductor.

As used herein and in the appended claims, the singular forms "a," "an," and "the" include plural referents unless the context clearly dictates otherwise. Thus, for example, reference to "a catholyte" includes a plurality of such catholytes and reference to "the electrode" includes reference to one or more electrodes, and so forth.

Unless defined otherwise, all technical and scientific terms used herein have the same meaning as commonly understood to one of ordinary skill in the art to which this disclosure belongs. Although methods and materials similar or equivalent to those described herein can be used in the practice of the disclosed methods and compositions, the exemplary methods, devices and materials are described herein.

Also, the use of "or" means "and/or" unless stated otherwise. Similarly, "comprise," "comprises," "comprising" "include," "includes," and "including" are interchangeable and not intended to be limiting.

It is to be further understood that where descriptions of various embodiments use the term "comprising," those skilled in the art would understand that in some specific instances, an embodiment can be alternatively described using language "consisting essentially of" or "consisting of"

It is to be understood that this disclosure is not limited to particular embodiments described, as such may, of course, vary. It is also to be understood that the terminology used herein is for the purpose of describing particular embodiments only, and is not intended to be limiting, since the scope of the present disclosure will be limited only by the appended claims.

Throughout this application, the term "about" is used to indicate that a value that can include similar values or that a value can include the standard deviation of error for the device or method being employed to determine the value. The term "about" when used before a numerical designation, e.g., temperature, time, amount, and concentration, including range, indicates approximations which may vary by (+) or (−) 20%, 10%, 5%, or 1%.

Unless defined otherwise, all terms of art, notations and other technical and scientific terms or terminology used herein are intended to have the same meaning as is commonly understood by one of ordinary skill in the art to which the claimed subject matter pertains. In some cases, terms with commonly understood meanings are defined herein for clarity and/or for ready reference, and the inclusion of such definitions herein should not necessarily be construed to represent a substantial difference over what is generally understood in the art.

Throughout this application, various embodiments may be presented in a range format. It should be understood that the description in range format is merely for convenience and brevity and should not be construed as an inflexible limitation on the scope of the disclosure. Accordingly, the description of a range should be considered to have specifically disclosed all the possible subranges as well as individual numerical values within that range. For example, description of a range such as from 1 to 6 should be considered to have specifically disclosed subranges such as from 1 to 3, from 1 to 4, from 1 to 5, from 2 to 4, from 2 to 6, from 3 to 6 etc., as well as individual numbers within that range, for example, 1, 2, 3, 4, 5, and 6. This applies regardless of the breadth of the range.

The disclosure provides an n-type semiconductor that includes iron (Fe) and tungsten (W) where all or a portion of the semiconductor has the crystal structure of the chemical compound $FeWO_4$. In some instances, the semiconductor includes or consists of iron (Fe), tungsten (W), and oxygen (O) or the semiconductor includes or consists of iron (Fe), tungsten (W), oxygen (O), and bismuth.

Additionally, the disclosure provides a semiconductor that includes or consists of $Fe_{1-x}W_xO_v+y(BiO_z)$ wherein: $0<x<1$; $0 \leq y<1$; $0<v<2$; and $1 \leq z \leq 2$ and at least a portion of the semiconductor has the crystal structure of the chemical compound $FeWO_4$. At least a portion of the semiconductor represented by $Fe_{1-x}W_xO_v+y(BiO_z)$ has the crystal structure of the chemical compound $FeWO_4$.

The inventors have unexpectedly found that the semiconductor changes from an n-type semiconductor to a p-type semiconductor when the value of the variable v is 2 or is increased above 2. As a result, the semiconductor can be an n-type semiconductor when $0<v<2$. In some instances, the semiconductor is included in a photoanode.

The semiconductor is surprisingly suitable for use as a light-absorbing semiconductor in the photoanode of a solar fuels generator. For instance, in one example the semiconductor has a 1.95±0.1 eV direct band gap and a turn-on potential of approximately 0.4 V vs RHE that is near its 0.35±0.1 flat band potential. Further, the exemplary semiconductor was chemically stable in acid and base environments. As a result, the semiconductor can surprisingly satisfy all three of the primary requirements for a semiconductor used in a photoanode.

Further, the reduction of the oxygen content in the semiconductor, such as occurs with a reduction of variable v in the formula $Fe_{1-x}W_xO_v+y(BiO_z)$, further reduces the turn-on voltage. The addition of Bismuth (such as occurs with an increase in the variable y in the formula $Fe_{1-x}W_xO_v+y(BiO_z)$, surprisingly reduces the oxygen content of the $Fe_{1-x}W_xO_v$. Accordingly, the addition of bismuth to the semiconductor reduces the turn-on voltage. Further, increasing the bismuth level generally leads to reduced turn-on voltage levels.

FIG. 1A is a perspective view of the semiconductor 5. The semiconductor 5 includes one or more external surfaces 6. Although not illustrated, in some instances, the semiconductor 5 includes one or more internal surfaces such as the surface of pores or surfaces at an interface between different crystal phases.

The semiconductor 5 can be an n-type semiconductor that includes iron (Fe) and tungsten (W) where all or a portion of the semiconductor has the crystal structure of the chemical compound $FeWO_4$. The crystal structure of $FeWO_4$ is a monoclinic crystal structure with divalent iron and hexavalent tungsten. In an n-type semiconductor, the majority carriers are negatively charged electrons where a p-type semiconductor has holes as the majority carriers. At least a portion of the iron (Fe) and tungsten (W) in the semiconductor can be included in the portion of the semiconductor with the crystal structure of $FeWO_4$. In some instances, the semiconductor includes or consists of iron (Fe), tungsten (W), and oxygen (O). At least a portion of the iron (Fe), tungsten (W), and oxygen (O) in the semiconductor can be included in the portion of the semiconductor with the crystal structure of $FeWO_4$. Alternately, the semiconductor can include or consist of iron (Fe), tungsten (W), oxygen (O), and bismuth (Bi). All or a portion of the (Fe), tungsten (W), oxygen (O), and bismuth (Bi) in the semiconductor can be included in the portion of the semiconductor with the crystal structure of $FeWO_4$.

The semiconductor can have a single crystal phase or multiple crystal phases. At least one of the crystal phases has the crystal structure of $FeWO_4$. In some instances, the semiconductor has a first crystal phases with the crystal structure of $FeWO_4$ and one or two crystal phases selected from a group consisting of a second crystal phase with the crystal structure of $Bi_2O_3$ and a third crystal phase with the crystal structure of $Fe_2O_3$. The first crystal phase can include or consist of Bi and O. The second crystal phase can include or consist of Bi and O. The third crystal phase can include or consist of Fe and O.

In some instances, the semiconductor 5 includes or consists of $Fe_{1-x}W_xO_v+y(BiO_z)$ wherein: $0<x<1$; $0 \leq y<0.1$ or 1; $0<v<2$; and $1 \leq z \leq 2$ and at least a portion of the semiconductor has $Fe_{1-x}W_xO_v$ in the crystal structure of the chemical compound $FeWO_4$. In some instances, the semiconductor 5 includes a single crystal phase in the crystal structure of $FeWO_4$. The crystal phase can include the $Fe_{1-x}W_xO_v$ arranged in the $FeWO_4$ crystal structure. In some instances, the semiconductor 5 includes crystal phases that have a crystal structure other than the crystal structure of $FeWO_4$. For instance, the semiconductor can include or consist of a first crystal phase with the crystal structure of $FeWO_4$ and one or two crystal phases selected from a group consisting of a second crystal phase with the crystal structure of $Bi_2O_3$ and a third crystal phase with the crystal structure of $Fe_2O_3$. In some instances, the semiconductor has one, two, or three conditions selected from the group consisting of: the first crystal phase including the $Fe_{1-x}W_xO_v$ arranged in the $FeWO_4$ crystal structure, the second crystal phase including the $BiO_z$ arranged in the crystal structure of $Bi_2O_3$ and the third crystal phase including Fe and O arranged in the crystal structure of $Fe_2O_3$. In some instances, the third crystal phase includes $FeO_a$ with $1<a<1.5$ arranged in the crystal structure of $Fe_2O_3$. In one example, y=0 and the semiconductor includes the first crystal phase and the third crystal phase where the first crystal phase includes or consists of iron (Fe), tungsten (W), and oxygen (O) and the third crystal phase includes or consists of iron (Fe) and oxygen (O). For instance, a semiconductor that includes $Fe_{0.62}W_{0.38}O_a$ had a majority crystal phase with the crystal structure of $FeWO_4$ and a chemical composition $Fe_{1-x}W_xO_v$ with $0<v<2$ and a minority crystal phase with the crystal structure of $Fe_2O_3$ and a chemical composition of $FeO_a$ with $1<a<1.5$ (believed to be $FeO_{1.5}$).

In another example where the semiconductor 5 is represented by $Fe_{1-x}W_xO_v+y(BiO_z)$, $y>0$ and the semiconductor includes the first crystal phase and the third crystal phase where the first crystal phase includes or consists of iron (Fe), tungsten (W), and oxygen (O) and the second crystal phase includes or consists of iron (Fe) and oxygen (O). At least a portion of the semiconductor represented by $Fe_{1-x}W_xO_y$ can be in the first crystal phase and at least a portion of the semiconductor represented by $(BiO_z)$ can be in the second crystal phase. The first crystal phase can have the structure of the chemical compound $FeWO_4$ and the second crystal phase can have the crystal structure of $BiO_z$. As an example, semiconductors that include $Fe_{0.56}W_{0.38}Bi_{0.06}O_v$, $Fe_{0.54}W_{0.35}Bi_{0.11}O_v$, $Fe_{0.59}W_{0.35}Bi_{0.06}O_v$, and $Fe_{0.59}W_{0.36}Bi_{0.05}O_v$ each had a majority crystal phase with the crystal structure of $FeWO_4$ and a chemical composition $Fe_{1-x}W_xO_v$ with $0<v<2$ and a minority crystal phase with the crystal structure of $Bi_2O_3$ and a chemical composition of $BiO_z$ with $1<z<2$.

A semiconductor 5 represented by $Fe_{1-x}W_xO_v$ (i.e. y=0) can be fabricated by co-sputtering sputter Fe and W and annealing the result in oxygen. A semiconductor 5 represented by $Fe_{1-x}W_xO_v+y(BiO_z)$ with y>0 can be fabricated by co-sputtering sputter Fe, W, and Bi and annealing the result in oxygen. The addition of Bismuth (such as occurs with an increase in the variable y in the formula $Fe_{1-x}W_xO_v+y(BiO_z)$) is associated with a decrease in the turn-on voltage level and that the increased bismuth level is generally associated with reduced turn-on voltage levels. The turn-on voltage is the lowest voltage that can be applied to the semiconductor 5 in order for the semiconductor to produce electrical current in response to illumination of the semiconductor 5 by a light source. Without being bound to theory, it is believed that the bismuth reduces the oxygen content of the portion of the semiconductor having the $FeWO_4$ crystal structure and that this reduction in the oxygen content reduces the turn-on voltage of the semiconductor 5.

When the semiconductor is represented by $Fe_{1-x}W_xO_v+y(BiO_z)$, x-ray diffraction and x-ray photoelectron spectroscopy have indicated that at least a portion of a second crystal phase represented by $(BiO_z)$ is present on an external surface of a first crystal phase ($Fe_{1-x}W_xO_v$ with the crystal structure of $FeWO_4$). Without being bound to theory, the second crystal phase being located on an external surface of the first crystal phase may reduce entry of oxygen into the first crystal phase during annealing. Blocking the entry of the oxygen into the first crystal phase may be the source of the reduced oxygen content in the first crystal phase represented by $Fe_{1-x}W_xO_v$ and having the crystal structure of $FeWO_4$. When the semiconductor includes a third crystal phase with the crystal structure of $Fe_2O_3$ as an alternative or in addition to a crystal phase with the crystal structure of $Bi_2O_3$, all or a portion of the third crystal phase may also be present on an external surface of a first crystal phase and may also play a roll in blocking the entry of oxygen into the first crystal phase.

The portion of the semiconductor with the crystal structure of $FeWO_4$ can be created by reducing the exposure of the metals to oxygen during the deposition of the metals. For instance, the metals can be sputtered in an inert gas atmosphere. Suitable inert gasses include, but are not limited to, Ar.

The semiconductor can have a turn-on voltage above 0.0 V vs RHE and below 1.0 V vs RHE or even below 0.45 V vs RHE and/or a direct band gap energy above 1 eV and below 2.4 eV.

Because the semiconductor 5 can be an n-type conductor, a photoanode can include or consist of the semiconductor 5. A photoanode absorbs light in a way that generates charge carriers that migrate to the surface and provide the charge equivalents necessary for an oxidation reaction such as oxygen evolution from water. The semiconductor 5 can absorb the light within the photoanode.

Figure 1B:
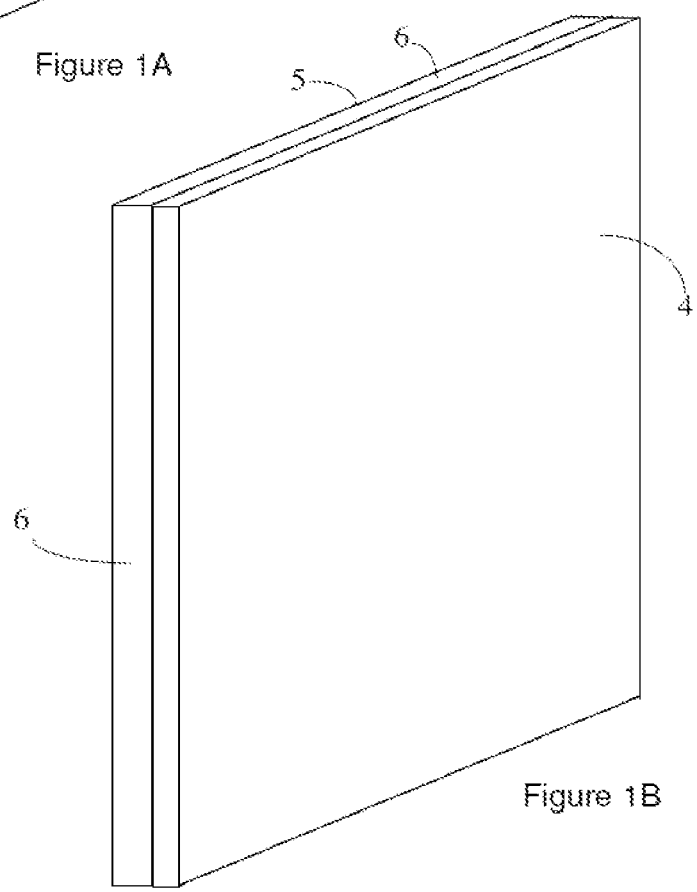
FIG. 1B is a perspective view of a photoanode that includes the semiconductor.

FIG. 1B illustrates the semiconductor 5 included in a photoanode. The photoanode includes a catalytic layer 4 on an external surface 6 of the semiconductor 5. The catalytic layer 4 can be in direct physical contact with the semiconductor 5. The catalytic layer 4 includes, consists of, or consists essentially of one or more of catalysts. The catalytic layer 4 can include components in addition to the one or more catalysts. For instance, the catalytic layer 4 can include one or more components selected from the group consisting of binders, polymers, membranes, electrical conductors, ionic conductors, solid electrolytes, porous materials, and inert support materials.

Figure 2:
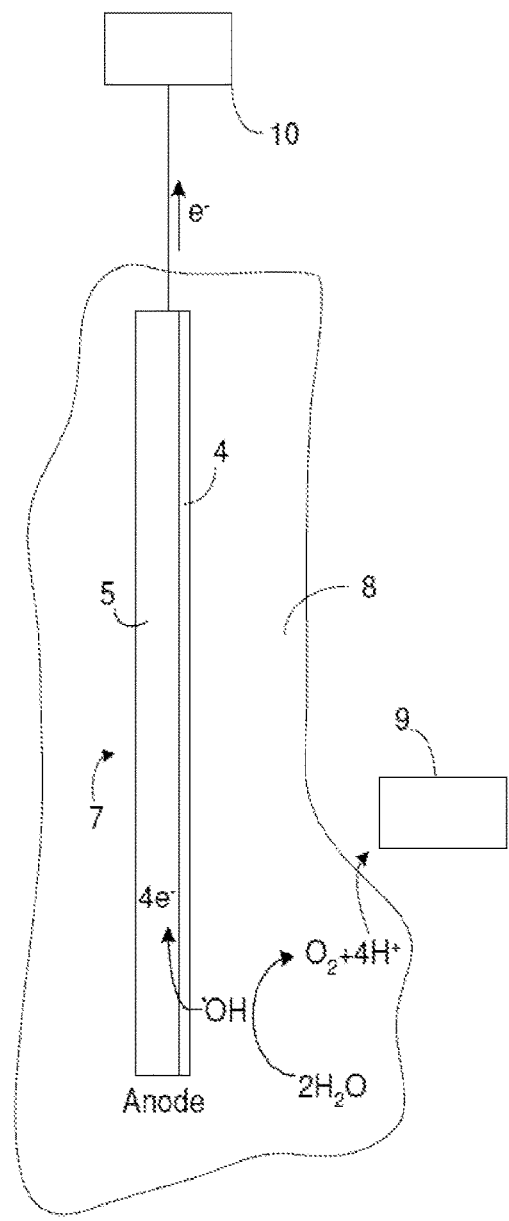
FIG. 2 illustrates an electro-oxidation system such as an oxygen evolution system.

FIG. 2 illustrates an electro-oxidation system such as an oxygen evolution system where the Oxygen Evolution Reaction (OER) occurs at a photoanode 7 that is in contact with an anolyte 8. The anolyte 8 can be a liquid, solid, or vapor. In some instances, the anolyte 8 includes one or more electrolytes in a solvent or mixture of solvents. Suitable solvents include, but are not limited to, acetonitrile or ethanol. Suitable electrolytes include, but are not limited to, potassium phosphate buffer, boric acid buffer, and sodium hydroxide.

The photoanode 7 can optionally be constructed as disclosed in the context of FIG. 1B. In an electro-oxidation system, suitable catalysts for use in the catalytic layer 4 include, but are not limited to, $Mn_uSb_vO_w$, $IrO_2$, and $RuO_2$. The photoanode 7 can optionally include one or more other layers (not illustrated) on one or more of the external surfaces 6 of the semiconductor 5 and/or on an external surface of the catalytic layer 4. Examples of the other layers include, but are not limited to, passivation layers. Suitable passivation layers for use on the semiconductor 5 include, but are not limited to, $Fe_2O_3$ and $WO_3$. When the photoanode 7 includes a passivation layer and a catalytic layer 4, the passivation layer can be between the semiconductor 5 and the catalytic layer 4 or the catalytic layer 4 can be between the passivation layer and the semiconductor 5. Additionally or alternately, a passivation layer and catalytic layer 4 can be positioned on different regions of the semiconductor 5. Because the semiconductor 5 is chemically stable in many environments to which the photoanode 7 will be exposed, the photoanode 7 can exclude a passivation layer.

The semiconductor 5 acts as a photoactive layer in the oxygen evolution system. For instance, the semiconductor 5 absorbs light and converts the absorbed light into excited electron-hole pairs that drive a chemical reaction such as the illustrated Oxygen Evolution Reaction (OER). The Oxygen Evolution Reaction is where oxygen gas is evolved from water or other oxides. One example of the oxygen evolution reaction is the oxidation of water by: $2H_2O \rightarrow O_2+4H^++4e^-$. Another example of the oxygen evolution reaction is $4OH^- \rightarrow O_2+2H_2O+4e^-$.

The absorption of light by the semiconductor 5 generates hole-electron pairs within the semiconductor 5. The presence of the n-type semiconductor 5 in the anolyte 8 produces an electrical field that causes the holes to move to the surface of the semiconductor 5 where the oxidation of water occurs as illustrated in FIG. 2. Oxidation of the water produces protons in the anolyte and electrons in the semiconductor 5.

When it is desirable for the oxygen evolution system to operate at steady state, the oxygen evolution system can include a proton-consuming component 9. The proton-consuming component 9 can consume the protons generated by the oxidation of water. The proton-consuming component 9 can depend on the application of the oxygen evolution system. For instance, the illustrated oxygen evolution system can be incorporated into a variety of different applications such as water electrolysis systems, solar fuels generators, electrowinning systems, electrolytic hydrogen generators, reversible fuel cells, and reversible air batteries. In one example, the photoanode and anolyte of FIG. 2 represent the photoanode and anolyte of a solar fuels generator that pairs the oxygen evolution reaction (OER) at the photoanode with the $CO_2$ reduction reaction or with the hydrogen evolution reaction (HER). In this example, protons generated by the oxygen evolution reaction (OER) can pass through a separator between the photoanode and the cathode and serve as a source of protons for the $CO_2$ reduction reaction and/or the hydrogen evolution reaction (HER). The $CO_2$ reduction reaction and/or the hydrogen evolution reaction (HER) consumes the protons generated at the photoanode and accordingly serves as the proton consuming component 9.

The oxygen evolution system includes a bias source 10. The bias source 10 can also depend on the application of the oxygen evolution system. Examples of suitable bias sources include, but are not limited to, batteries, grid power, solar energy, solar cells, wind, and hydropower. The electrons generated within the semiconductor 5 by the absorption of light can travel away from the photoanode and toward the bias source 10. Another example of a suitable bias source is the photoanode 7 itself. For instance, the excited electron-hole pairs can drive the chemical reaction at the photoanode. Accordingly, the semiconductor 5 can serve as the bias source.

Figure 3:
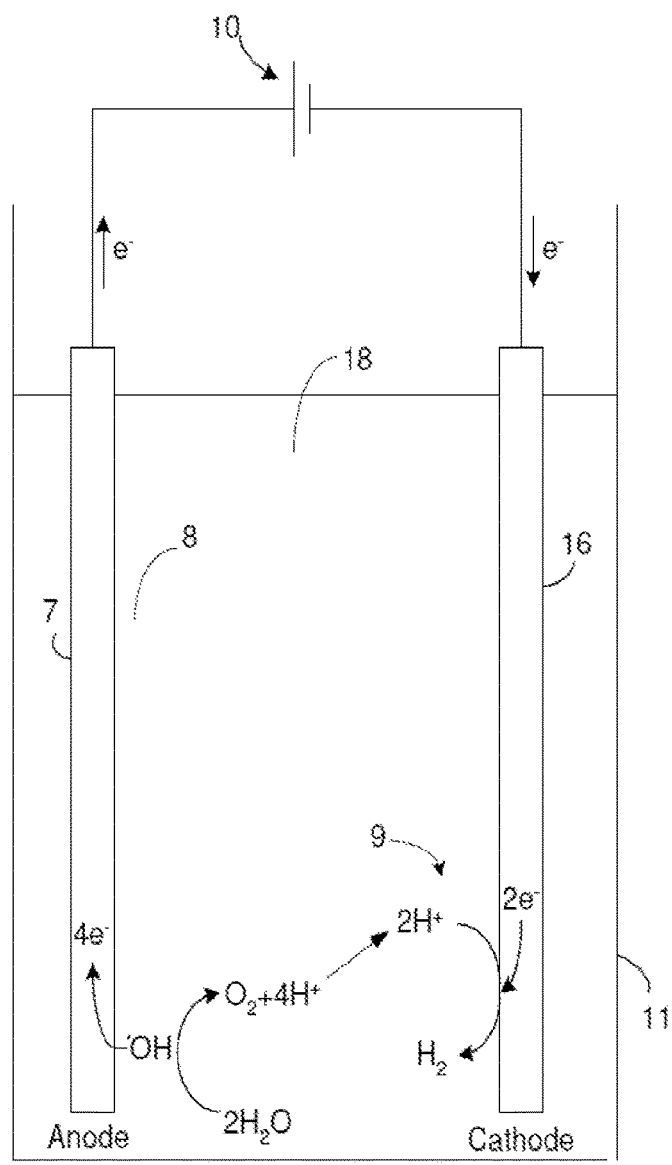
FIG. 3 illustrates a system for water electrolysis that incorporates the electro-oxidation system, of FIG. 2.

FIG. 3 provides an example of a water electrolysis system that includes the oxygen evolution system of FIG. 2. The system includes a vessel 11 having a reservoir. Photoanodes 7 and cathodes 16 are positioned in the reservoir such that photoanodes 7 and cathodes 16 alternate with one another. The photoanodes 7 and cathodes 16 are parallel or substantially parallel with one another. The photoanodes are constructed according to FIG. 1A and/or FIG. 2. A medium 18 is positioned in the reservoir such that photoanodes 7 and the cathodes 16 are in contact with the medium 18. The cathode and photoanode are connected to a bias source 10 that is sufficient to apply the overpotential needed to cause the water electrolysis illustrated in FIG. 3. The bias source 10 can be any voltage source such as a photovoltaic voltage source, battery or other electronics.

Figure 4A:
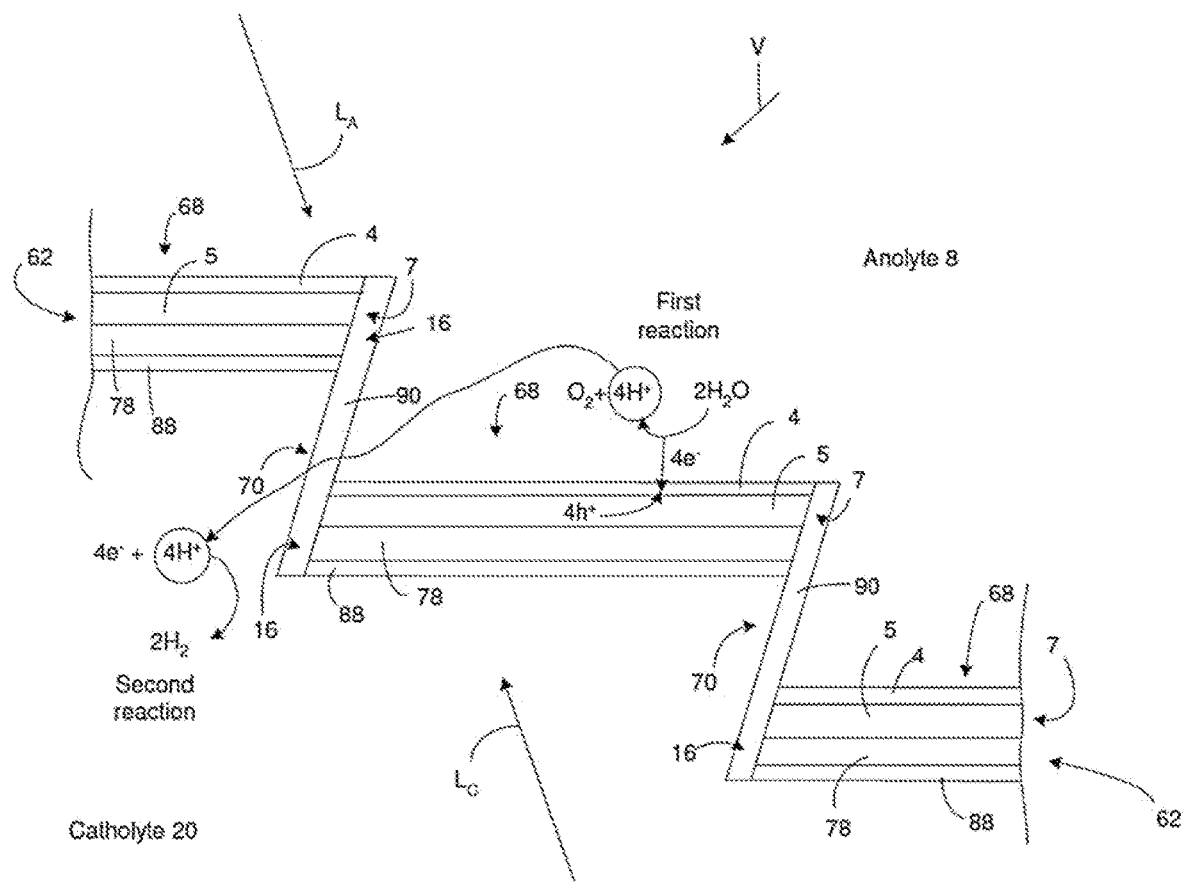
FIG. 4A is a cross section of a solar fuels generator.
Figure 4B:
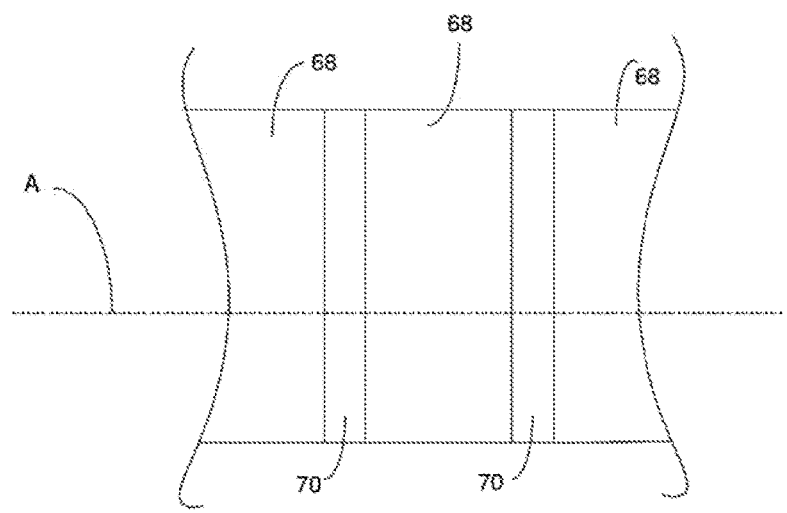
FIG. 4B is a sideview of the solar fuels generator shown in FIG. 4A taken looking in the direction of the arrow labeled V in FIG. 4A. The cross section shown in FIG. 4A can be taken along the line labeled A in FIG. 1B.

FIG. 4A is a cross section of a solar fuels generator that includes the oxygen evolution system of FIG. 2. FIG. 4B is a sideview of the solar fuels generator shown in FIG. 4A taken looking in the direction of the arrow labeled V in FIG. 4A. The cross section shown in FIG. 4A can be taken along the line labeled A in FIG. 4B.

The solar fuels generator includes a barrier 62 between the anolyte 8 and a catholyte 20. The barrier 62 includes or consists of one or more reaction components 68 and one or more separator components 70. FIG. 4A illustrates the reaction components 68 linked with separator components 70 so as to form the barrier 62 between the anolyte 8 and the catholyte 20. The reaction components 68 are alternated with the separator components 70. Each reaction component 68 contacts both the anolyte 8 and the catholyte 20 and each separator component 70 contacts both the anolyte 8 and the catholyte 20. The barrier 62 is formed such that the anolyte 8 can be maintained at a different chemical composition than the catholyte 20. For instance, the barrier 62 can be impermeable or substantially impermeable to nonionic atoms and/or nonionic compounds.

The reaction components 68 include photoanodes 7 and cathodes 16. As illustrated by the arrow labeled $L_A$ and $L_C$, light is incident on the photoanodes 7 and/or cathodes 16 during operation of the solar fuels generator. The photoanodes 7 and cathodes 16 convert the received light into excited electron-hole pairs that drive a chemical reaction, such as the electrolysis of water. The photoanodes 7 includes the semiconductor 5. The semiconductor 5 has a bandgap that allows the semiconductor 5 to absorbs solar light and light within the visible range. For instance, the semiconductor $Fe_{0.56}W_{0.38}Bi_{0.06}O_v$ had a majority crystal phase with the crystal structure of $FeWO_4$ and a chemical composition $Fe_{1-x}W_xO_v$ with $0<v<2$; a minority crystal phase with the crystal structure of $Bi_2O_3$, and a direct band gap energy of 1.95±0.1 eV.

Suitable materials for the cathode light absorbers 78 include, but are not limited to, p-type silicon, InP, $Cu_2O$, GaP, and $WSe_2$.

In some instances, the cathode light absorbers 78 are doped. The doping can be done to form one or more pn junctions within the cathode light absorbers 78. For instance, the cathode light absorber 78 can be a p-type semiconductor. A pn junction can also be present within the cathode light absorbers 78, and can be arranged so that electrons flow from the cathode light absorber 78 to a reduction catalyst (discussed below).

The dashed lines at the interface of the semiconductor 5 and the cathode light absorber 78 illustrate an interface between the materials of the semiconductor 5 and the cathode light absorber 78.

The absorption of light by the cathode light absorber 78 and the semiconductor 5 generates the photovoltage that drive a reaction such as water electrolysis. When semiconductors and/or the above photoactive components are used for the cathode light absorber 78 and the semiconductor 5, the achievable voltage depends on the choice of materials, the associated bandgaps, and doping arrangements, as are known in the field of solar cells. Accordingly, the material selections and arrangements can be selected to provide the desired voltage levels. For instance, tandem and multijunction structures in which two or more components in series add their voltages together can be used in order to achieve elevated voltages.

The anodes 7 include one or more catalytic layers 4 that can be constructed as disclosed above. When light is to be incident on the photoanode as shown by the arrow labeled $L_A$, the light passes through one or more catalytic layers 4 before reaching the semiconductor 5. As a result, the one or more catalytic layers 4 can be thin enough that the one or more catalytic layers 4 do not absorb an undesirably high level of the incoming light. A suitable thickness for the catalytic layer 4 includes, but is not limited to, a thickness less than 10 nm to a few micrometers.

The cathodes 16 include one or more reduction catalyst layers 88 that each includes or consists of one or more reduction catalysts. One or more reduction catalyst layers 88 can be in direct physical contact with the cathode light absorber 78 as is shown in FIG. 4A. As is evident from FIG. 4A, when light is to be incident on the cathode, the light passes through one or more reduction catalyst layers 88 before reaching the cathode light absorber 78. As a result, the one or more reduction catalyst layers 88 can be transparent and/or thin enough that the one or more reduction catalyst layers 88 do not absorb an undesirably high level of the incoming light. A suitable thickness for a reduction catalyst layer 88 includes, but is not limited to, a thickness of about 1 nm to 10 μm. In some instances, the catalyst layer 88 does not need to be transparent. For instance, the catalyst layer 88 need not be transparent if it is facing down (i.e., is facing away from the incident light source).

Suitable reduction catalysts include, but are not limited to, Pt, NiMo, and NiCo. The one or more reduction catalyst layers 88 are positioned on a surface of the cathode light absorber 78 such that a line that is perpendicular to the surface extends from the surface through one or more of the reduction catalyst layers 88 before extending through the catholyte 20. The one or more reduction catalyst layers can be positioned such that the one or more reduction catalyst layers are on more than 10%, 30%, 50%, 75%, or 90% of the surface of the cathode light absorber 78.

The separator components 70 include or consist of a separator 90 located between the anolyte 8 and the catholyte 20. The separator 90 is ionically conductive. In some instances, the separator 90 is cationically conductive while concurrently being sufficiently nonconductive to the other components of the anolyte 8 and the catholyte 20 that the anolyte 8 and the catholyte 20 remain separated from one another. In other instances, the separator 90 is cationically conductive and non-conductive or substantially non-conductive to nonionic atoms and/or nonionic compounds. In some instances, the separator 90 is cationically conductive while being non-conductive or substantially non-conductive to nonionic atoms and/or nonionic compounds and also to anions. Accordingly, the separator 90 can provide a pathway along which cations can travel from the anolyte 8 to the catholyte 20 without providing a pathway or a substantial pathway from the anolyte 8 to the catholyte 20 to one, two, or three entities selected from a group consisting of anions, nonionic atoms or nonionic compounds. In some instances, it may be desirable for the separator 90 to conduct both anions and cations. For instance, when the anolyte 8 and/or the catholyte 20 has elevated pH levels a separator 90 that conducts both anions and cations may be used. As a result, in some instances, the separator 90 conducts cations and anions but not nonionic atoms or nonionic compounds.

Additionally, in some instances, the separator 90 is able to exchange ions sufficiently to prevent the buildup of a pH gradient, and separate the reaction products sufficiently to prevent them from re-combining. A suitable separator 90 can be a single layer or material or multiple layers of materials. Suitable materials for the separator 90 include, but are not limited to, ionomers and mixtures of ionomers. Ionomers are polymers that include electrically neutral repeating units and ionized repeating units. Suitable ionomers include copolymers of a substituted or unsubstituted alkylene and an acid such as sulfonic acid. In one example, the ionomer is a copolymer of tetrafluoroethylene and perfluoro-3,6-dioxa-4-methyl-7-octene-sulfonic acid. A suitable material is sold under the trademark NAFION®. NAFION® is an example of a material that is cationically conductive of cations but is not conductive of anions or nonionic atoms or nonionic compounds. Another suitable separator 90 includes NAFION® functionalized with one or more components selected from a group consisting of dimethylpiperazinium cationic groups, glass frits, asbestos fibers, block copolymer formulated layers, and poly(arylene ether sulfone) with quaternary ammonium groups.

During operation, the solar fuels generator is exposed to light such as sunlight, terrestrial solar illumination, AM1.5 solar radiation, or similar illumination having approximately 1 kilowatt per square meter of incident energy or less. These light sources can be unconcentrated or can be concentrated using known light concentration devices and techniques. In some instances, the solar fuels generator is oriented such that the light travels through the photoanodes before reaching the cathodes. When the semiconductor 5 has a larger bandgap than the cathode light absorber 78, the photoanodes absorb higher energy (shorter wavelength) light and allow lower energy (longer wavelength) light to pass through to the cathodes. The cathodes can then absorb the longer wavelengths. Alternately, the light can be incident on both the photoanodes and the cathodes or can be incident on the cathodes before reaching the photoanodes.

The absorption of light by a semiconductor 5 generates hole-electron pairs within the semiconductor 5. The presence of an n-type semiconductor 5 in the anolyte 8 produces an electrical field that causes the holes to move to the surface of the semiconductor 5 where the oxidation of water occurs as illustrated by the first reaction in FIG. 4A. The electrons generated in the semiconductor 5 move toward the cathode light absorber 78 as a result of the electrical field.

The protons generated in the first reaction move from the semiconductor 5 into the anolyte 8. Since the separator 90 is cationically conductive, the protons move from the anolyte 8 to the catholyte 20 through the separator 90. As a result, the pathlength for the protons is reduced to the thickness of the separator 90. A suitable thickness for the separator 90 is a thickness of about 100 nm to 1 μm or more.

The absorption of light by the cathode light absorber 78 generates hole-electron pairs within the cathode light absorber 78. The presence of a p-type cathode light absorber 78 in the catholyte 20 produces an electrical field that causes the electrons within the cathode light absorber 78 to move to the surface of the cathode light absorber 78 and then the surface of the reduction catalyst layers 88 where they react with the protons to form hydrogen gas as illustrated by the second reaction in FIG. 4A. The generated fuel can enter the catholyte 20 and can be stored for later use. The holes generated in the cathode light absorber 78 by the absorption of light move from the cathode light absorber 78 toward the semiconductor 5 as a result of the electrical field and can recombine with the electrons from the semiconductor 5.

The anolyte 8 is generally different from the catholyte 20. For instance, the anolyte 8 generally has a different chemical composition than the catholyte 20. The anolyte 8 and the second phase can both be a liquid. For instance, the anolyte 8 can be a standing, ionically conductive liquid such as water.

A suitable method for forming reduction catalyst layers 88 on the cathode light absorber 78 includes, but is not limited to, electrodeposition, sputtering, electroless deposition, spray pyrolysis, and atomic layer deposition. A suitable method for attaching the separator 90 to the photoanodes 7 and/or cathodes 16 includes, but is not limited to, clamping, lamination, sealing with epoxy or glue and the like.

EXAMPLES

Example 1

Several samples of the semiconductor were synthesized atop a 100-mm-diameter either glass substrate with $SnO_2$:F conducting layer (Tec-15) or Si wafer with thermal $SiO_2$ layer by co-sputtering of metal targets using radio-frequency (RF) power supplies in a custom-designed combinatorial sputtering system, and post-deposition annealed at 610° C. for 1 hour. The semiconductor samples were deposited as metals in Ar gas of 0.8 Pa with $10^{-5}$ Pa base pressure and were followed by a post-deposition anneal in a box oven at 610° C. in air for 1 hour.

X-ray fluorescence (XRF) measurements were performed to determine the compositions of the sample semiconductors using an EDAX Orbis Micro-XRF system with an x-ray beam approximately 2 mm in diameter. The sensitivity factor for each element was calibrated using commercial XRF calibration standards (Micromatter™). XRF was performed on a 2 mm spacing of 1521 positions on the composition libraries. The semiconductors had compositions $Fe_{0.56}W_{0.38}Bi_{0.06}O_v$, $Fe_{0.54}W_{0.35}Bi_{0.11}O_v$, $Fe_{0.59}W_{0.35}Bi_{0.06}O_v$, $Fe_{0.62}W_{0.38}O_v$, and $Fe_{0.59}W_{0.36}Bi_{0.05}O_v$. The $Fe_{0.56}W_{0.38}Bi_{0.06}O_v$, $Fe_{0.54}W_{0.35}Bi_{0.11}O_v$, $Fe_{0.59}W_{0.35}Bi_{0.06}O_v$, and $Fe_{0.59}W_{0.36}Bi_{0.05}O_v$. The different compositions were achieved by accessing the semiconductor from different locations in the co-sputter system corresponding to different relative distances from the deposition sources for Fe, W, and Bi.

Example 2

X-ray diffraction (XRD) was used to determine the crystal structures and phase distribution of the semiconductor samples from Example 1. The XRD was performed using a Bruker DISCOVER $D_8$ diffractometer with Cu Kα radiation from a Bruker TO source. Diffraction images were collected using a two-dimensional VÅNTEC-500 detector and integrated into one-dimensional patterns using DIFFRAC. SUITE™ EVA software.

The x-ray diffraction showed the semiconductor samples represented by $Fe_{0.56}W_{0.38}Bi_{0.06}O_v$ had a majority crystal phase with the crystal structure of $FeWO_4$ and a chemical composition $Fe_{1-x}W_xO_v$ with $0<v<2$ and a minority crystal phase with the crystal structure of $Bi_2O_3$ and a chemical composition of $BiO_z$ with $1<z<2$.

The x-ray diffraction showed the semiconductor samples represented by $Fe_{0.54}W_{0.35}Bi_{0.11}O_v$ had a majority crystal phase with the crystal structure of $FeWO_4$ and a chemical composition $Fe_{1-x}W_xO_v$ with $0<v<2$ and a minority crystal phase with the crystal structure of $Bi_2O_3$ and a chemical composition of $BiO_z$ with $1<z<2$.

The x-ray diffraction showed the semiconductor samples represented by $Fe_{0.59}W_{0.35}Bi_{0.06}O_v$ had a majority crystal phase with the crystal structure of $FeWO_4$ and a chemical composition $Fe_{1-x}W_xO_v$ with $0<v<2$ and a minority crystal phase with the crystal structure of $Bi_2O_3$ and a chemical composition of $BiO_z$ with $1<z<2$.

The x-ray diffraction showed the semiconductor sample represented by $Fe_{0.62}W_{0.38}O_v$ had a majority crystal phase with the crystal structure of $FeWO_4$ and a chemical composition $Fe_{1-x}W_xO_v$ with $0<v<2$ and a minority crystal phase with the crystal structure of $Fe_2O_3$ and a chemical composition of $Fe_{1-x}W_xO_v$ with $0<v<2$.

The x-ray diffraction showed the semiconductor sample represented by $Fe_{0.59}W_{0.36}Bi_{0.05}O_v$ had a majority crystal phase with the crystal structure of $FeWO_4$ and a chemical composition $Fe_{1-x}W_xO_v$ with $0<v<2$ and a minority crystal phase with the crystal structure of $Bi_2O_3$ and a chemical composition of $BiO_z$ with $1<z<2$.

Example 3

Optical properties of the $Fe_{0.56}W_{0.38}Bi_{0.06}O_v$ were characterized using a custom-built on-the-fly scanning ultraviolet-visible dual-sphere spectrometer to record transmittance and total reflectance simultaneously. The band gap energies were estimated by automatic Tauc analysis. The optical spectra were acquired on a 2-mm-grid of 1521 positions on the semiconductor samples.

A direct-allowed Tauc plot for the $Fe_{0.56}W_{0.38}Bi_{0.06}O_v$ indicated a 1.95±0.1 eV direct band gap energy. The $Fe_{0.56}W_{0.38}Bi_{0.06}O_v$ exhibited absorption over the entire measured wavelength with absorptivity exceeding $4\times10^4$ cm$^{-1}$ for photon energies above the 1.95±0.1 eV direct-allowed band gap.

Example 4

Fiber-coupled scanning droplet cell (SDC) instrumentation was used to measure photoelectrochemical activity. Experiments included an aqueous pH 9 borate electrolyte with 0.01 M sodium sulfite as sacrificial hole acceptor at four pH values (1, 3, 7, and 9) and LED illumination with four different wavelengths. Initial experiments measured four sequential chronoamperometry (CA) measurements at 1.23 V versus RHE with four LEDs toggled with 0.5 s on, 0.5 off illumination: 3.2±0.05 eV for 15 s; and 2.74±0.09, 2.4±0.09, and 2.07±0.03 eV all for 4 s each. Lastly, cyclic voltammetry (CV) was performed with 3.2 eV illumination with light toggling 2 s on, 1 s off, and a voltage range of 1.23 to 0.73 to 1.53 V versus RHE (rate of 0.02 V s$^{-1}$). The SDC was rastered along the $Fe_{0.56}W_{0.38}Bi_{0.06}O_v$ and performed a sequence of experiments performed every 5.5 mm on the $Fe_{0.56}W_{0.38}Bi_{0.06}O_v$. External quantum efficiency (EQE) was calculated using photocurrent measured at 1.23 V vs RHE at each illumination energy and an illumination area of 0.0113 cm$^2$. Photoelectrochemical stability was characterized by 30 mins chopped-illumination (10 s on, 5 s off) photocurrent measurements at 1.23 eV vs RHE on select samples with 2.4 eV illumination in various electrolytes.

The longer stability measurements include 34 repetitions of the ~100 s CV and 50 min CA. Between each repetition, the electrochemical cell was removed for about 2 minutes for maintenance (flushing solution through the fritless Ag/AgCl microelectrode to maintain a stale reference potential). For days 6 and 7 this time of air exposure was increased to 30 min, providing an increase in the subsequent photocurrent compared to repeated CV+CA measurements on previous days. The sample was kept in ambient air for approximately 18 hours between days of testing, except for after day 4 where approximately 70 hours elapsed between measurements including exposure to vacuum for the XRF measurement, and after day 6 where approximately 40 hours elapsed between measurements, which corresponds to a total span of 10 calendar days for the 7 days of PEC testing. After overnight air exposure the initial photocurrent, and after multiple-day air exposure the decay in the photocurrent is also more gradual. The signals from the 3rd CA of day 4 and the 3rd CA of day 6 show variability that is believed to originate from an issue with the PEC cell, in particular with light transmission and reference electrode potential variation, respectively.

The CVs provided by the $Fe_{0.56}W_{0.38}Bi_{0.06}O_z$ sample indicated a turn-on potential of approximately 0.4 V vs RHE near its 0.35±0.1 V vs RHE flat band potential.

Example 5

The stability of the photoanode in strong acid war evaluated using the $Fe_{0.59}W_{0.35}Bi_{0.06}O_z$ by performing a toggled illumination CV in 0.1 M $H_2SO_4$ with 0.1 M methanol added as a hole scavenger. While the photocurrent density was lower in the pH 1.4 electrolyte, stable photocurrent during 30 min toggled-illumination at 1.23 V vs RHE indicated successful passivation in the $H_2SO_4$.

Longer-term stability of $Fe_{0.59}W_{0.36}Bi_{0.05}O_z$ was assessed by repeating the electrochemical procedure 34 times over the course of 7 days of testing (10 calendar days): a CV similar to that of Example 4 was followed by approximately 50 min CA at 1.23 V vs RHE during which the sample was illuminated 97% of the time with a broadband light source (W35, Doric LEDc2, 107 mW cm$^{-2}$ irradiance). Combined with XRF and SEM characterization, the results indicated no detectable corrosion or changes in film morphology during extensive photoelectrochemical operations. The evolution of the photoactivity is surprising, with loss of approximately 20% of photocurrent through the course of the day with recovery upon exposure to air overnight.

Although the electro-oxidation system is disclosed above in the context of an oxygen evolution system, the disclosed electro-oxidation system can be used in conjunction with other reactions such as sulfite oxidation, ferrocene/ferrocenium redox couple, and dye degradation.

Other embodiments, combinations and modifications of this invention will occur readily to those of ordinary skill in the art in view of these teachings. Therefore, this invention is to be limited only by the following claims, which include all such embodiments and modifications when viewed in conjunction with the above specification and accompanying drawings.

The invention claimed is:

1. A composition of matter, comprising:
an n-type semiconductor,
at least a portion of the semiconductor having the crystal structure of the chemical compound represented by $FeWO_4$; and
the portion of the semiconductor having the crystal structure of $FeWO_4$ including Fe, O, Bi and W.

2. The composition of claim 1, where in the semiconductor consists of the O, the Fe, the Bi, and the W.

3. The composition of claim 1, wherein the semiconductor is represented by $Fe_{1-x}W_xO_v+y(BiO_z)$ wherein:
0<x<1;
0≤y<1;
0<v<2; and
1≤z≤2.

4. The composition of claim 3, wherein the semiconductor includes a first crystal phase having $Fe_{1-x}W_xO_v$ arranged in the crystal structure of $FeWO_4$.

5. The composition of claim 4, wherein the semiconductor includes a second crystal phase having $BiO_z$ arranged in the crystal structure of $Bi_2O_3$.

6. The composition of claim 4, wherein the semiconductor includes the second crystal phase on an exterior surface of the first crystal phase.

7. The composition of claim 4, wherein the semiconductor includes a second crystal phase having the crystal structure of $Fe_2O_3$.

8. The composition of claim 1, wherein the semiconductor has a turn-on voltage above 0.0 V vs RHE and below 0.45 V vs RHE and a direct band gap energy above 1 eV and below 2.4 eV.

9. A photoanode having a light-absorbing layer that includes the semiconductor of claim 1.

10. An electro-oxidation system that includes the photoanode of claim 9.

11. A solar fuels generator that includes the photoanode of claim 9.

12. A composition of matter includes a semiconductor represented by $Fe_{1-x}W_xO_v+y(BiO_z)$ wherein:
0<x<1,
0≤y<1,
0<v<2, and
1≤z≤2; and
at least a portion of the semiconductor is arranged in the crystal structure of $FeWO_4$.

13. The composition of claim 12, wherein the portion of the semiconductor with the crystal structure of $FeWO_4$ has a chemical composition represented by $Fe_{1-x}W_xO_v$.

14. The composition of claim 13, wherein y>0.

15. The composition of claim 13, wherein at least a portion of the semiconductor is arranged in the crystal structure of $Bi_2O_3$.

16. The composition of claim 12, wherein y>0.

17. The composition of claim 12, wherein at least a portion of the semiconductor is arranged in the crystal structure of $Fe_2O_3$.

* * * * *